United States Patent
He et al.

(10) Patent No.: US 8,630,137 B1
(45) Date of Patent: Jan. 14, 2014

(54) DYNAMIC TRIM METHOD FOR NON-VOLATILE MEMORY PRODUCTS

(75) Inventors: Yi He, Fremont, CA (US); Larry Wang, San Jose, CA (US); Sean Lynch, Ben Lomond, CA (US); Che-Ping Chen, Sunnyvale, CA (US); Wei Zhao, Fremont, CA (US); Albert Bergemont, Palo Alto, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 432 days.

(21) Appl. No.: 13/028,131

(22) Filed: Feb. 15, 2011

Related U.S. Application Data

(60) Provisional application No. 61/304,653, filed on Feb. 15, 2010.

(51) Int. Cl.
G11C 29/00 (2006.01)

(52) U.S. Cl.
USPC .............. 365/201; 365/189.07; 365/185.2

(58) Field of Classification Search
USPC ................. 365/201, 189.07, 185.2
See application file for complete search history.

(56) References Cited

U.S. PATENT DOCUMENTS

| | | | |
|---|---|---|---|
| 5,844,347 A | 12/1998 | Takayama et al. | |
| 6,307,447 B1 | 10/2001 | Barber et al. | |
| 6,457,093 B2 * | 9/2002 | Roohparvar | 711/103 |
| 7,567,472 B2 * | 7/2009 | Gatzemeier et al. | 365/201 |
| 7,944,750 B1 | 5/2011 | Bergemont et al. | |
| 2001/0042159 A1 * | 11/2001 | Roohparvar | 711/103 |
| 2004/0115881 A1 | 6/2004 | Choi et al. | |
| 2005/0030827 A1 | 2/2005 | Gilliland et al. | |
| 2005/0270850 A1 | 12/2005 | Wang et al. | |
| 2006/0244043 A1 | 11/2006 | Wang et al. | |
| 2006/0256633 A1 * | 11/2006 | Louie et al. | 365/201 |
| 2009/0290441 A1 * | 11/2009 | Gatzemeier et al. | 365/201 |
| 2010/0110786 A1 * | 5/2010 | Kang et al. | 365/185.2 |

FOREIGN PATENT DOCUMENTS

JP 2004-135163 A 4/2004

OTHER PUBLICATIONS

Tapani Makkonen, Tuomas Pensala, Juha Vartiainen, Jouni V. Knuuttila, Jyrki Kaitila, Martti M. Salomaa, "Estimating Materials Parameters in Thin-Film BAW Resonators Using Measured Dispersion Curves," Jan. 2004, pp. 42-51, IEEE, vol. 51., No. 1.
Non-Final Office Action dated Jul. 21, 2010, U.S. Appl. No. 12/288,762, filed Oct. 22, 2008, Albert Bergemont et al.
Final Office Action dated Oct. 27, 2010, U.S. Appl. No. 12/288,762, filed Oct. 22, 2008, Albert Bergemont et al.

* cited by examiner

*Primary Examiner* — Tuan T. Nguyen
(74) *Attorney, Agent, or Firm* — Advent, LLP

(57) ABSTRACT

A dynamic trim method includes testing a selected number of cells on a die with predetermined testing margins. Data from this testing is used to determine dynamic reference margins for improving yield. Advantageously, yield is improved by allowing functioning fast or slow units to pass wafer sort by applying the dynamic reference margins for varying processes.

11 Claims, 6 Drawing Sheets

DYNAMIC TRIM METHOD FOR NON-VOLATILE MEMORY PRODUCTS

PRIORITY CLAIM

This application claims priority under 35 U.S.C. §119(e) of the U.S. provisional patent application Ser. No. 61/304,653, filed Feb. 15, 2010, and titled DYNAMIC TRIM METHOD FOR NON VOLATILE MEMORY PRODUCTS," which is hereby incorporated by reference.

FIELD OF THE INVENTION

This invention relates to memory circuits. More specifically, this invention relates to methods and apparatus for improving manufacturing yield of memory circuits.

BACKGROUND OF THE INVENTION

Non-volatile memory (NVM) or non-volatile storage, is generally a semiconductor storage device that is able to retain the stored information even after the removal of a power source. Most types of magnetic computer storage devices (e.g. hard disks, floppy disks, and magnetic tape), optical discs, and early computer storage methods such as paper tape and punch cards, maintains its memory even after power is lost. However, semiconductor non-volatile memory typically comprises EPROM (Electrically Programmable Read Only Memory), EEPROM (Electrically Erasable and Programmable Read Only Memory) and flash memory. NVM is typically used for the task of secondary storage, or long-term persistent storage.

Electrically addressed systems include, but are not limited to, EPROM, EEPROM, and flash memory. Although different types of electrically addressed systems have different structures, the general method of writing data and deleting data is similar. The structures include arrays of individual memory cells that are able to be programmed to hold a logic level 1 or 0. These individual memory cells are able to be floating gate transistors or SONOS (Silicon-Oxide-Nitride-Oxide-Silicon) transistors, such as in the case of EEPROMs, or NOR and NAND logic gates, such as in the case of FLASH memory.

FIG. 1A shows a SONOS memory device 50. The device 50 is a modified transistor, having a gate 55, drain 56 and source 57 that are generally etched from a metal deposited on a substrate 59 to form a memory transistor. In SONOS memory devices, data, in the form of charge, is stored and is retained when the power is removed. The SONOS memory device has a polysilicon control gate 52 and a nitride layer 51 that functions as a charge storage element. The nitride layer 51 is electrically isolated by surrounding oxide including an oxide layer 53 and a gate oxide layer 60. The control gate 52 is the external control terminal of the memory transistor 50.

In the case of a n-type SONOS MOSFET, when in operation, with no charge on the nitride layer 51, the device 50 acts normally, and a voltage applied to the control gate 52 causes current to flow as in a standard MOSFET. When the nitride layer 51 is charged, the charge shifts the MOSFET threshold voltage so that, with the same control gate voltage, current does not flow. In the case of a p-type SONOS MOSFET, when in operation, with no charge on the nitride layer 51, the device 50 has no current flow when a voltage is applied to the control gate 52 as in a standard p-MOSFET. When the nitride layer 51 is charged, the charge shifts the MOSFET threshold voltage to positive so that, with the same control gate voltage, current starts to flow. Charging the nitride layer 51 is generally accomplished by grounding the source terminal, biasing the drain terminal, and placing sufficient voltage on the control gate 52 such that charge tunnels through the oxide 60 to the nitride layer 51. This is typically called channel-hot-electron (CHE) programming. Alternatively, SONOS devices can also be programmed with a sufficient gate-to-substrate voltage. This mechanism is known as "Fowler-Nordheim" (FN) Tunneling. A reverse gate-to-substrate voltage clears the charge from the nitride layer 51 by causing the charge to dissipate into the substrate 59. In the case of n-type SONOS, charges in the nitride layer 51 can also be cleared by a negatively biased control gate 52 and a positively biased source/drain. This mechanism is known as "Hot Hole Band-to-Band Tunneling".

In terms of CHE programming, charging the nitride layer 51 and thereby storing data in the memory device 50 is able to be achieved by a process known as hot carrier injection. The memory cell 50 is programmed by charging the nitride layer 51 via the injection of hot-electrons from the pinch-off region of the drain 56. The hot-electrons get their energy from the voltage applied to the drain 56 and the source 57 of the memory cell 50. They are accelerated by a lateral electric field along the channel into even higher fields surrounding the drain depletion region. Once these electrons gain sufficient energy they surmount the energy barrier between the silicon substrate and the silicon dielectric layer or gate oxide and are trapped in the nitride layer 51. With a positive voltage applied to the drain 56 and a positive voltage applied to the gate 55, electrons are pulled toward the nitride layer 51 and then trapped in the nitride of an n-channel memory cell.

FIG. 1B shows a floating gate memory device 150. The device 150 is a modified transistor, having a gate 155, drain 156 and source 157 that are generally etched from a metal deposited on a substrate 159 to form a memory transistor. In floating gate memory devices, data, in the form of charge, is stored and is retained when the power is removed. The floating gate memory device comprises a polysilicon first gate 151 that is known as a "floating gate" because it is buried within a gate oxide 160 and a dielectric 153 beneath a polysilicon control gate 152. In some devices, this dialectric 153 is known as the inter-polysilicon dialectric (IPD). The IPD 153 isolates the floating gate 151 and is able to be oxide or oxide-nitride-oxide (ONO). The control gate 152, which is the second gate, is the external control terminal of the memory transistor 150.

In operation, with no charge on the floating gate 151, the device 150 acts normally, and a voltage applied to the control gate 152 causes current to flow as in a standard MOSFET. When the floating gate 151 is charged, the charge shifts the MOSFET threshold voltage so that, with the same control gate voltage, current does not flow. Charging the floating gate 151 is similarly accomplished as charging the nitride layer 51 in the SONOS memory device of FIG. 1A, for example using FN Tunneling or hot carrier injection.

As the person of ordinary skill having the benefit of this disclosure will recognize, both FN Tunneling and hot carrier injection are functions of energy fields formed by voltages applied to any of the gate or drain of a memory transistor. As a result, variation in the process to form these devices, thereby causing variation in the size of the gate, drain, or width of the control gate, nitride layer, floating gate, oxide layers or dielectric, or any like component in a similar memory device, will cause thresholds required to trap electrons in the SONOS device or the floating gate device to change. In application, these thresholds are parameters in end products that must conform to pre-determined requirements, since an end user will place a device having many millions of memory transistors or other cells into some terminal interface which will either write data, erase data, or read data by applying signals of pre-determined magnitudes. Should a device have different thresholds, the applied signals will not trigger a write, read, or erase function, and as a result a device having non-conforming thresholds is discarded as a manufacturing failure.

FIG. 1C shows common thresholds for writing to and erasing from electrically addressed NVM. A program (PGM) margin level 100 is the level at which a signal must be presented to an individual memory cell or unit in order for that unit to hold a binary or logic "1" or "high." The signal is able to be presented in the form of cell current or applied voltage Vg, also known as threshold voltage. An erase (ERS) margin level 110 is the level at which a signal must be presented to an individual memory cell or unit in order for that unit to hold a binary or logic "0" or "low." In general, devices are tested in a process known as wafer sort. Individual die, each having a large number of individual memory cells thereupon, are tested whole as a plurality of probes contact the I/O of each individual die to ascertain whether the individual memory cells have PGM and ERS levels that conform to predetermined requirements. A typical test result 101 determines whether an actual level 101A of a signal which satisfies a PGM operation was sufficient to complete a PGM step into an individual memory cell. The PGM level 101A is above the PGM margin level 100 and therefore the PGM test during wafer sort would be a pass. Also, an actual ERS level 101B is below the ERS margin level 110. As a result, the die exhibiting these characteristics is generally a "pass" or conforming unit. However, as is well known, silicon wafers can suffer process variations. The extremes of these variations are known as process corners. The variation is caused for example, by variations in deposition depth, metal layer thickness, or any host of reasons during the wafer fabrication process. A process corner causing a fast PGM and slow ERS 102 has a PGM level 102A that passes, but a ERS level 102B that fails. However, the difference between the ERS level 102A and the PGM level 102B is the same as the difference between the PGM level 101A and the ERS level 101B. A process corner causing a fast ERS and slow PGM 103 has a passing ERS level 103B but a failing PGM level 103A. Again, there is a healthy window between the ERS level 103B and the PGM level 103A, which is the same as the difference between the PGM level 101A and the ERS level 101B. Because of the wide window between ERS and PGM program levels, the device can be viable for use. However, due to the rigid PGM margin level 100 and ERS margin level 110, the devices fail and the wafer suffers lower overall yield. The PGM level 100 and ERS margin level 110 are generally set by a universal "trimming" step wherein the levels 100 and 110 are programmed as fixed values into a lot of wafers. What is needed is a method and system for dynamic trimming so that individual die can have varying margin levels, thereby better coping with process variations and tolerances to processes having wide variations from the onset, allowing for the use of cheaper, more widely varying processes while still leading to increased product yield.

SUMMARY OF THE INVENTION

A novel method of trimming memory devices with dynamic margin levels, a memory device having dynamic margin levels, a memory system and a method of operating a memory device are disclosed herein. Advantageously, manufacturing yields will increase due to rigid pre-determined margin levels being replaced with margin levels dynamically determined depending on actual margin levels within a memory device.

In a first aspect of the invention, a memory device comprises a plurality of memory cells and a set of margin levels. The memory cells are able to be modified SONOS, floating gate transistors, logic gates, or the like. Preferably, the memory device is configured to communicate the set of margin levels to a controller. The margin levels include but are not limited to a program reference, an erase reference, program verify reference, erase verify reference and a read reference. In operation, the fact that the margin levels are dynamically determined based upon default reference levels and test results is transparent to an end user. In general, memory systems comprise a memory device and a controller for signaling instructions to the memory device. The memory device, such as a FLASH memory chip or the like, transmits the dynamically determined margin levels to the controller. The controller is able to be programmed to transmit instructions in accordance with the margin levels. Advantageously, a memory device that normally would have failed wafer sort and been discarded will instead be put to use in a memory system, thereby reducing waste and increasing yield.

In another aspect of the invention, a method for trimming memory devices, comprises selecting a sample number of memory devices among a plurality of memory devices and encoding a default margin level on the selected samples. In some embodiments, selecting a sample number of memory devices among a plurality of memory devices comprises selecting sectors from a plurality of locations on a die. The selected samples are then exposed to a test signal, such as program or erase commands or the like, to determine the average response of each memory device, e.g. the program or erase speed of the die. In some embodiments, an average response is determined by comparing the test signal to a set of predetermined references. In other embodiments, the average response is determined using a liner search or a binary search. Advantageously, a binary search is able to cut down on total process time. Then, a program margin level is able to be determined based on the determined average, and an erase margin level is able to be based upon the determined average. Preferably, the method further comprises trimming the selected numbers of memory devices with the program margin and erase margin levels, comparing an overall yield to a yield achieved with the default margin levels, and trimming the remaining plurality of memory devices with the program margin and erase margin levels.

In another aspect of the invention, a memory system comprises a memory device having a plurality of dynamically determined margin levels and a controller for transmitting instructions to the memory device, wherein the instructions correspond to the dynamically determined margin levels. Preferably, the memory device is configured to communicate the plurality of margin levels to the controller, and the controller is configured to adjust instructions to correspond to the margin levels. In some embodiments, the memory device is able to communicate the plurality of dynamically determined margin levels to the controller in response to an event, such as an instruction triggered by the controller, the memory device, or an external device. For example, upon initiation or power up of the system, the memory device is able to communicate default margin levels to the controller so that the controller adjusts instructions transmitted to the memory device accordingly. In another aspect of the invention, a method of operating a memory device comprises determining a plurality of margin levels for a memory device, transmitting at least one margin level among the plurality of margin levels to the controller, and receiving an instruction corresponding to the at least one margin level.

In operation, what is achieved is a higher manufacturing yield of memory devices by sampling only a portion of memory devices of each die on a wafer, and using threshold and margin data from those samples to determine appropriate margin levels for that die. Because these levels are dynamically determined, the margin levels are optimized for each die to cope with process variations. Therefore, a previously failing die that have higher or lower margin levels due to process variation but are otherwise perfectly functioning and acceptable devices will be considered a passing die, which reduces unnecessary yield loss. Advantageously, a higher yield translates to lower cost, and the memory device market is especially unforgiving to increased cost. These dynamic margin levels are able to be communicated to a controller that transmits instructions to the memory device. In general, controllers are able to be readily programmed to perform a wide variety of functions, such as transmit instructions at a desired signal level to the memory device. The controller is able to adjust the signal level according to the dynamically determined margin levels supplied by the memory device. Any cost associated with the programming of the controller will be inconsequential compared with the cost of discarding memory devices during a wafer sort or final test step because otherwise functional memory devices do not meet rigid, predetermined margin levels.

DETAILED DESCRIPTION OF THE DRAWINGS

Reference will now be made in detail to the embodiments of the yield improvement method and apparatus of the invention, examples of which are illustrated in the accompanying drawings. While the invention will be described in conjunction with the embodiments below, it will be understood that they are not intended to limit the invention to these embodiments and examples. On the contrary, the invention is intended to cover alternatives, modifications and equivalents, which may be included within the spirit and scope of the invention as defined by the appended claims. Furthermore, in the following detailed description of the present invention, numerous specific details are set forth in order to more fully illustrate the present invention. However, it will be apparent to one of ordinary skill in the prior art that the present invention may be practiced without these specific details. In other instances, well-known methods and procedures, components and processes haven not been described in detail so as not to unnecessarily obscure aspects of the present invention. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1A:
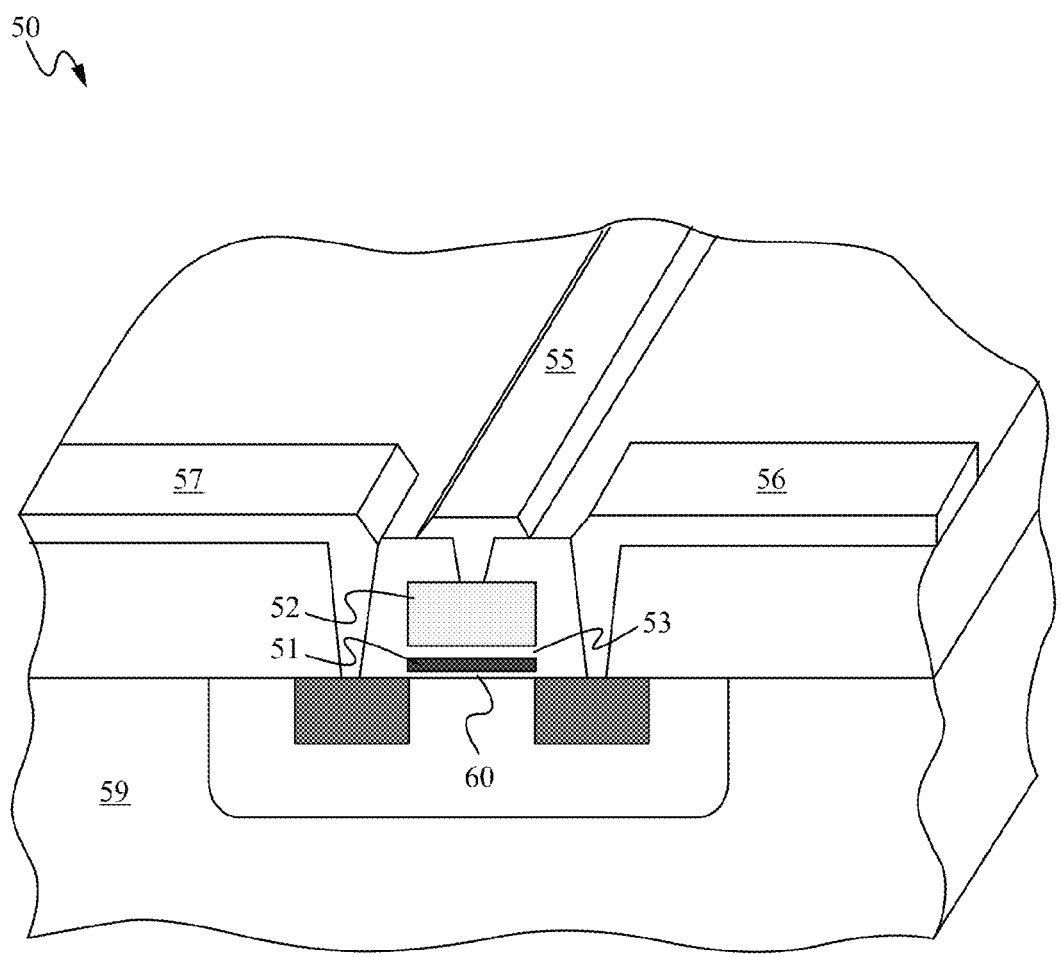
FIG. 1A shows a common SONOS memory device.
Figure 1B:
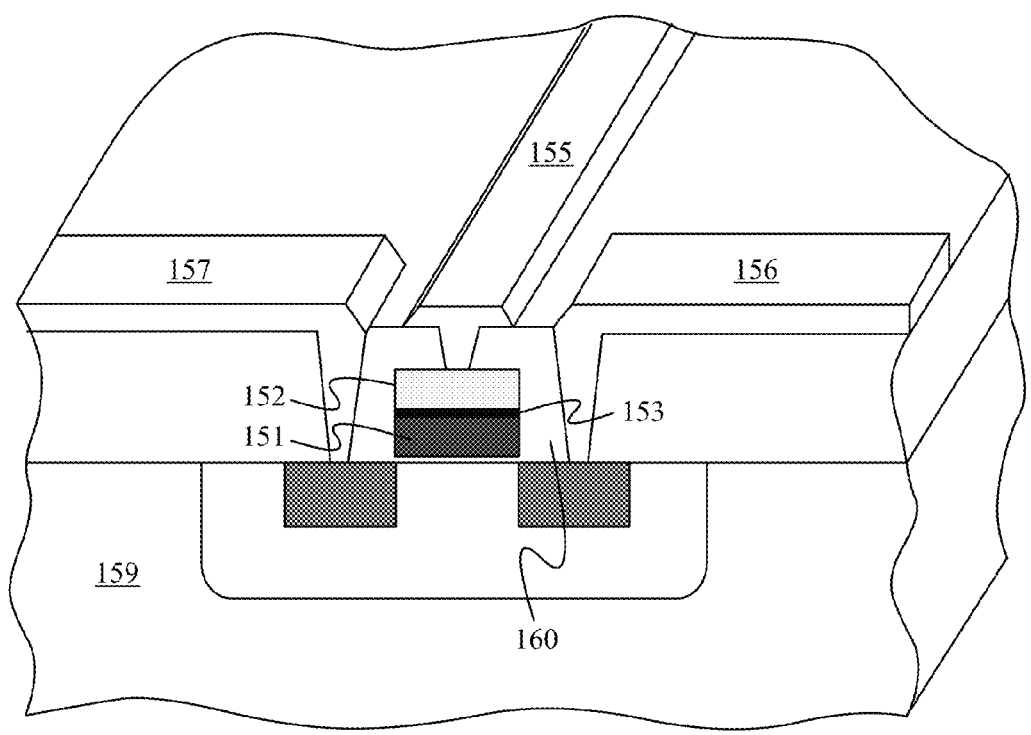
FIG. 1B shows a common floating gate memory device.
Figure 1C:
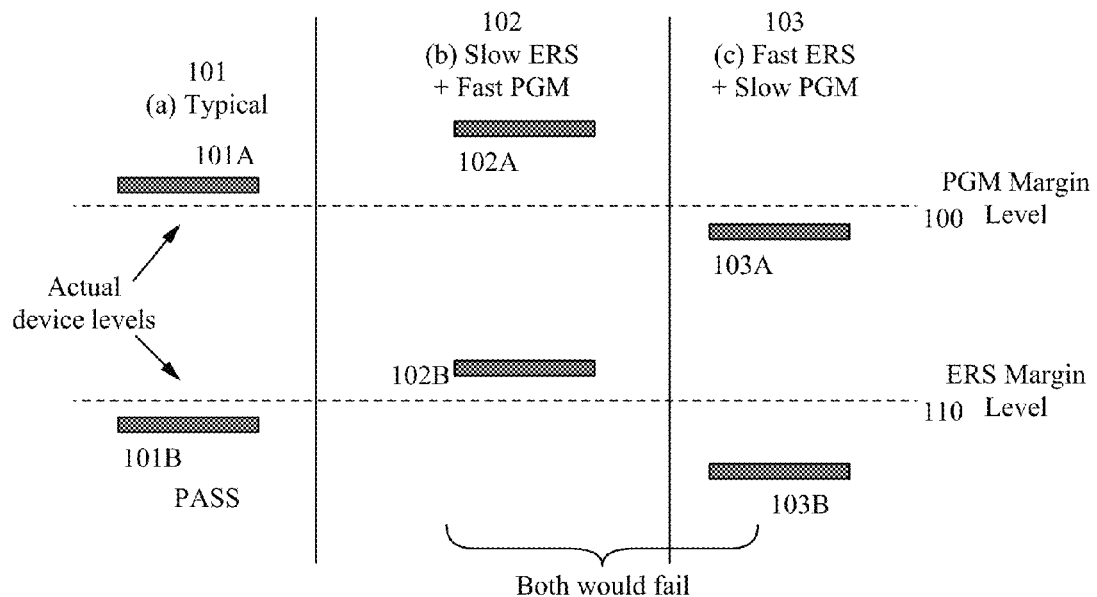
FIG. 1C shows a prior art PGM and ERS margin levels.
Figure 2:
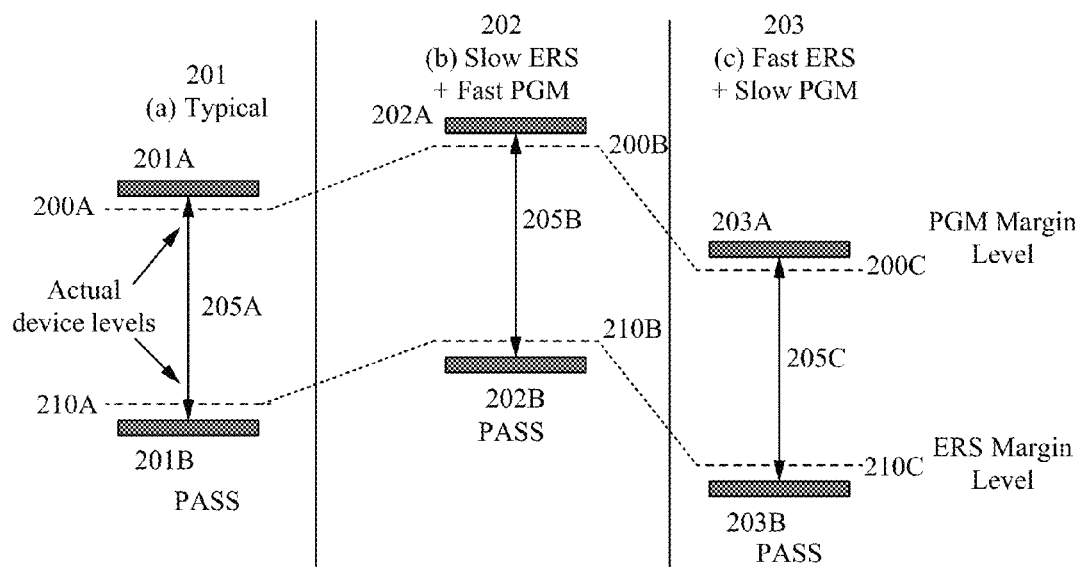
FIG. 2 shows dynamically determined PGM and ERS threshold margin levels.

Methods and apparatus for improving the yield of semiconductor based non volatile memory devices are disclosed herein. FIG. 2 shows a typical process 201, a fast PGM and slow ERS corner 202, and a fast ERS and slow PGM corner 203. As discussed above, variations in process can cause the typical 201 and corners 202 and 203 to manifest themselves within a lot of wafers or all on one wafer. As a result, devices illustrated in corners 202 and 203 having an ample window between PGM and ERS margin levels will be labeled as non conforming failures and discarded. In one embodiment of the instant invention, the PGM margin levels and ERS margin levels are dynamic based upon the actual PGM and ERS program levels of individual die.

In a typical process 201, a PGM margin level 200A is set such that a passing actual PGM level 201A is above the PGM margin level 200A. A passing ERS level 201B is below an ERS margin level 210A. A window 205A between the actual PGM level 201A and ERS level 201B is sufficiently wide such that false 1s or 0s are not a concern. The fast PGM corner 202 shows a similar window 205B. The actual PGM level 202A is higher than the typical PGM margin level 200A. However, the actual ERS level 202B is higher than the typical ERS margin level 210A. In the prior art discussed above, this unit would be a failing unit and be discarded although the window 205B is the same as the window 205A. Advantageously, what is dynamically provided is a new PGM margin level 200B and a new ERS margin level 210B such that the "fast" PGM 202A and "slow" ERS 202B conform to the new margin levels respectively and the unit is considered a pass. Again, because the window 205B between the fast PGM level 202A and the slow ERS level 202B is sufficiently wide, the "fast" PGM margin level 200B and "slow" ERS margin level 210B do not cause faulty units, capable of storing false 1s and 0s, to pass wafer sort.

Similarly, the "slow" PGM corner 203 exhibits an actual PGM level 203A and an actual ERS level 203B. Once again, the window 205C between the slow PGM level 203A and fast ERS level 203B is nearly identical to the window 205A of the typical process 201 and the window 205B of the fast PGM corner 202. However, because the slow PGM level 203A would have been lower than the PGM margin level 200A, a failure would have resulted causing the die to be discarded. Advantageously, the PGM margin level 200C and ERS margin level 210C are shifted accordingly to the fast ERS 203B and slow PGM 203A. In general, the varying of the channel length and the ONO/oxide thickness of the transistors used in the memory cell are the greatest contributor to the "fast" and "slow" variations. A shorter channel length makes for easier charging, or a "fast" PGM. A thinner ONO/oxide thickness makes for easier discharging, or a "fast" ERS.

In some embodiments, the dynamic margin levels 200B and 210B for die originating from a fast PGM corner and the dynamic margin levels 200C and 210C for die originating from a fast ERS corner are able to be determined by six sigma statistical analysis of a large number of individual die. The term "six sigma" comes from the notion that if one has six standard deviations between the process mean and the nearest specification limit, practically no items will fail to meet specifications. Capability studies measure the number of standard deviations between the process mean and the nearest specification limit in sigma units. As process standard deviation goes up, or the mean of the process moves away from the center of the tolerance, fewer standard deviations will fit between the mean and the nearest specification limit, decreasing the sigma number and increasing the likelihood of items outside specification. By using such statistical analysis, for example by statistical analysis of the program margin level of each individual memory cell within a die, and then individual die within a wafer, the variation in an individual die can be accounted for, such that the large plurality of individual memory cells within the die are able to all conform to the limit unless there is a true failing unit. By way of example, testing 1 out of every 8 individual cells on a die is able to yield enough statistical data to properly set PGM margin and ERS margin levels for that die. In some embodiments a binary search is able to be utilized to find the average program margin level for each individual die. Alternatively, a built in self test (BIST) algorithm programmed into the individual die is able to achieve the statistical analysis necessary to determine dynamic trim levels for a PGM margin level and an ERS margin level.

The dynamic levels determined by, for example, a 6 sigma statistical process are able to be programmed into the individual die. Therefore, when the die is used in application, it will have included within instructions relating to what PGM margin level and ERS margin level is necessary to set for that particular chip.

Figure 3:
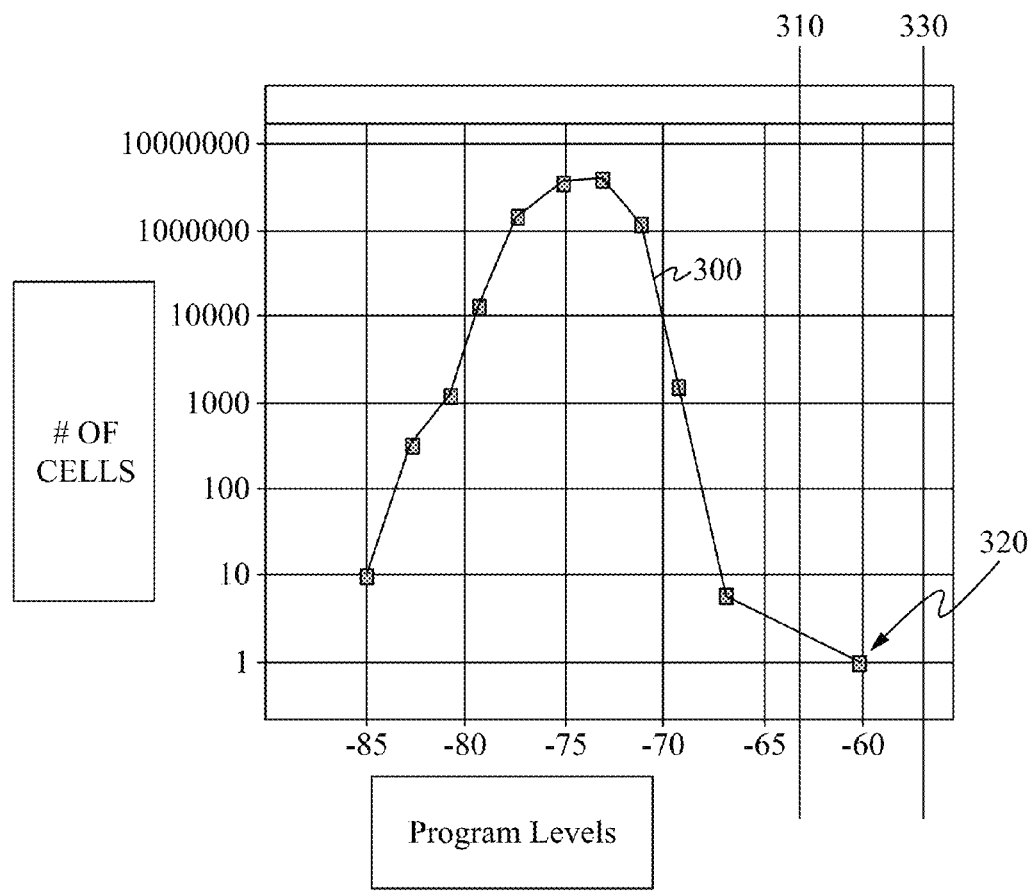
FIG. 3 shows a distribution of individual cells versus program level.

FIG. 3 shows a distribution 300 of memory cells versus program levels. The X axis is the program level of each memory cell. The Y axis is the number of individual memory cells at each program level. The distribution 300 represents, in this graph, approximately 1 million memory cells and their respective ON currents. The dynamically trimmed PGM margin level 310 shows that the vast majority of units to the left of the level 310 pass. However, an outlying cell 320 is still able to be detected. The previous margin level 330 would have allowed this outlier 320 and other outliers to pass. Advantageously, when the PGM margin level 310 is dynamically determined and trimmed, not only is yield improved, but outliers are more readily detected and flagged.

Figure 4:
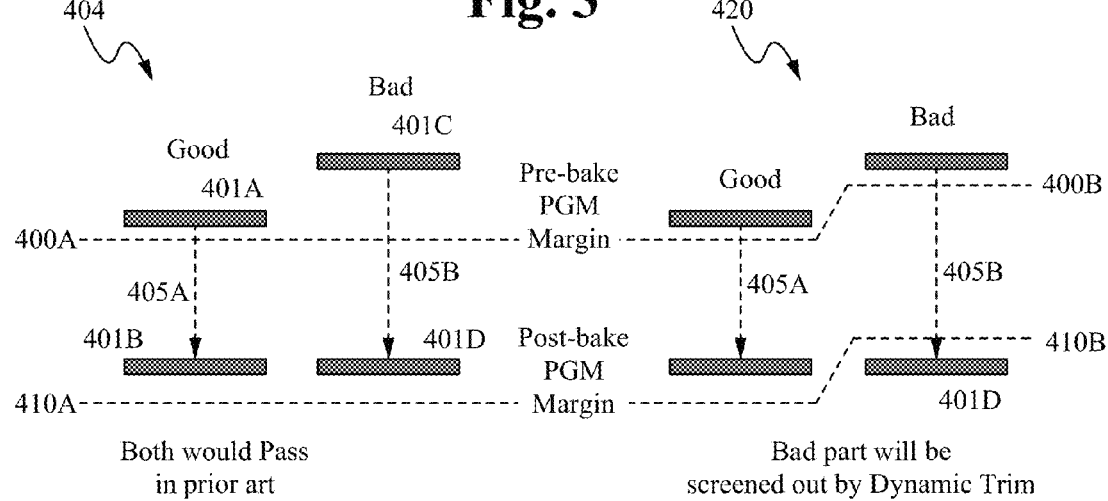
FIG. 4 shows pre and post bake margin levels at wafer sort.

FIG. 4 shows a representation of prior art long term operational life (OpLife) testing 404 and OpLife screening using the instant method of dynamic trim 420. In general, OpLife testing consists of placing individual die in an on board application and exposing that application to a combination of pressure, temperature and humidity to simulate a desired time period of use. For example, if the device OpLife were to be extrapolated to 10 years, appropriate heat, pressure and humidity can be applied for a period of a few days to simulate 10 years of wear. In general, over time, memory devices can lose the stored charge and their "PGM" status can flip due to degradation, which OpLife testing is done to catch. OpLife testing is also referred to as "baking" due to the temperature applied to the tested product. As a result, there is a "pre bake" actual PGM level, which represents the amount of current or charges required to hold a binary or logic "1" or "high" before the bake, and a post bake PGM level, which is the amount of current or charges for it to maintain a binary or logic "1" or "high" after the bake. What is most interesting is the change in the charge (also referred to as "charge loss") during the "bake" procedure. In prior art OpLife testing, an acceptable charge loss 405A between a pre bake actual PGM level 401A and a post bake PGM level 401B cannot be distinguished from an unacceptable charge loss 405B. The pre-bake actual PGM level 401C is well above the pre-bake PGM margin level 400A. In a bad part, the amount of charge loss exceeds a predetermined threshold. The prior art could not identify apart that lost excessive charge but still met other threshold levels. The test of this invention will screen out parts with excessive charge loss even when they otherwise would pass other screening tests. When using dynamic trim 420 described herein, the pre-bake PGM margin level 400B and post-bake PGM margin level 410B is dynamically set. As a result, the larger charge loss 405B results in a failed unit because the actual post-bake PGM level 401D is below the acceptable post-bake PGM margin level 410B.

Figure 5:
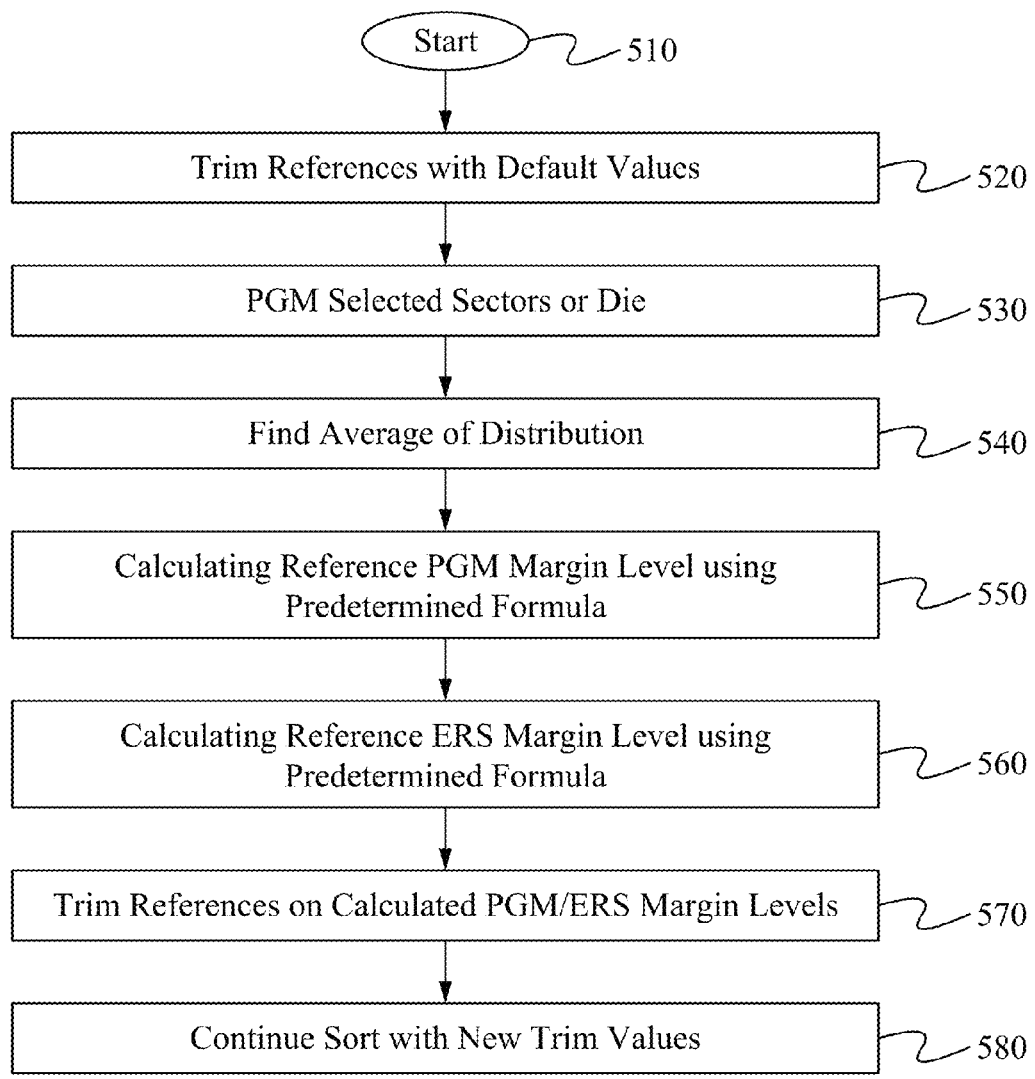
FIG. 5 is a flowchart of the process of the instant invention.

FIG. 5 is a flowchart 500 showing the process steps to achieve dynamic trim for PGM and ERS margin levels. In a start step 510, a number of sectors on a wafer are chosen to achieve an accurate statistical distribution. In some embodiments, every 1 out of 8 cells on a die is able to be a sufficiently large distribution. It is advantageous to select these sectors from various parts of the wafer in order to capture any variations on the wafer itself. In a step 520, the selected die are trimmed with default PGM and ERS margin levels. Next, in a step 530, the sectors are exposed to a PGM function and an average is determined in a step 540. In order to determine the average, the cell current of every memory cell in these selected sectors are compared to a pre-set current reference, and based on the comparison result, it will readily be apparent whether the lot is "fast" or "slow". The average current can be obtained by several different ways. One of the conventional ways is to progressively scan the currents of every cell in these sectors and compute the average current from data vectors. This is typically known as "linear search". Another way is to perform a binary search in which the currents of all the cells in these sectors are compared to an adjustable current reference. If more than half of the cells have higher current than the current reference, then adjust the current reference higher and compare again. If more than half of the cells have lower current than the current reference, then adjust the current reference lower and compare again. Repeat the above steps until a current reference is found when exactly half the cells have higher current and half the cells have lower current than the reference. A binary search can be advantageous due to its inherently shorter test time. The average is described above in terms of determining an average current. Alternatively, an average threshold voltage can be determined. Specifically, the linear and binary search methods can also be used to determine the average threshold voltage. In general, the step 540 determines an average programmed level, such as an average current or an average threshold voltage. In a step 550, reference PGM margin levels are calculated based on the inputs of the average programmed levels from the selected sectors and individual die, and also past performance of several lots of wafers can be included to better ascertain the performance of the process used to fabricate the devices over time. In a step 560, reference ERS and normal read margin levels are computed using a similar algorithm as 550. In some embodiments, the steps 550 and 560 are able to be a single algorithm computation. Subsequently, all other reference margin levels, such as read, program verify, erase verify, etc., are able to be determined in a similar fashion to complete the necessary reference margin levels.

Next, in a step 570, the selected sectors or die are trimmed with the new PGM, ERS, and other margin levels determined in steps 550 and 560. In some embodiments, trimming comprises activating and deactivating a plurality of current sources already embedded upon the individual die, thereby forming a composite current source capable of delivering desired reference margin levels corresponding to the dynamically selected PGM, ERS, and other margin levels. In a step 580, the remainder of wafer-level sort tests are performed regularly to complete the sort, or test, of the die using the dynamically trimmed PGM, ERS, and other margin levels determined in steps 550-570.

In operation, an end user is able to implement a memory device having been dynamically trimmed by using the processes described above into their application in a "plug and play" method. Internal registers within the die will signal the application to use more or less current to perform a PGM or ERS function. For simplicity and ease of understanding, only ERS and PGM levels have been discussed herein. However, a person of ordinary skill having the benefit of this disclosure will readily appreciate that the methods described herein can be applied to any logic threshold level desired, including but not limited to READ, ERS VERIFY, PGM VERIFY, ERS READY, PGM READY, or the like.

Figure 6:
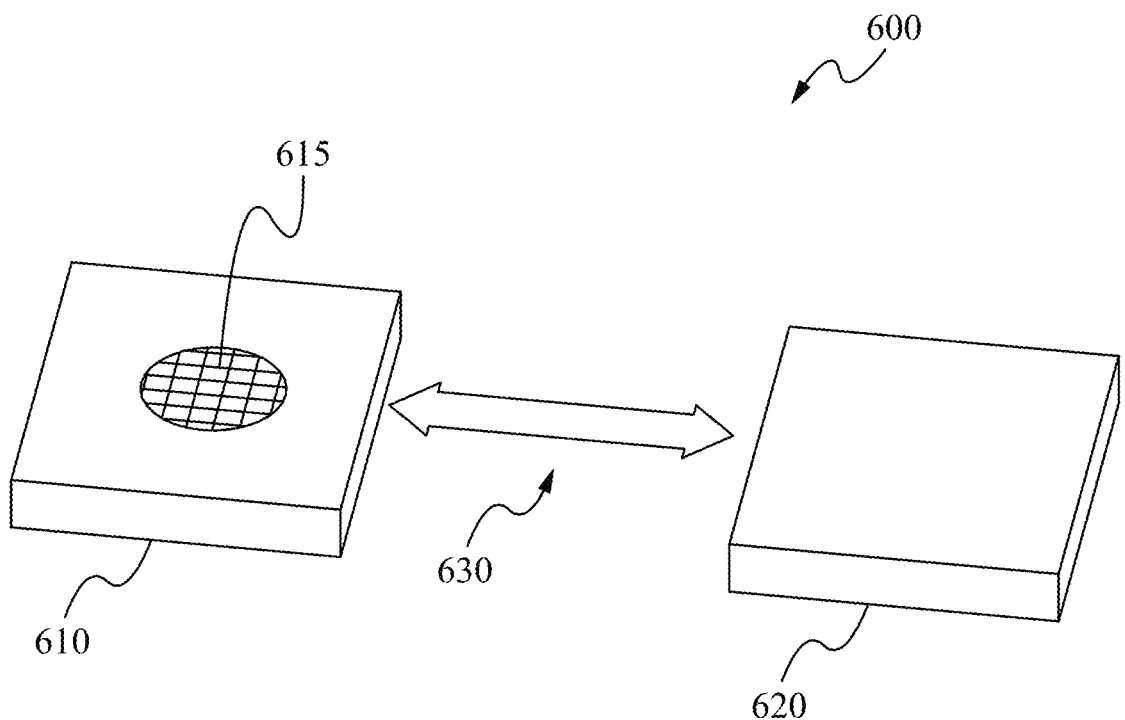
FIG. 6 is a system per an embodiment of the current invention.

FIG. 6 shows the instant invention in operation. A memory system 600 comprises a memory device 610 and a controller 620 coupled by communication bus 630. The bus 630 enables electrical communication between the memory device 610 and the controller 620. In general, memory devices 610 are controlled by a memory controller 620. The memory controller signals various instructions to the memory device, for example, instructing the memory device to store a piece of data (PGM) or to erase some or all of its memory (ERS) or to read memory stored in the device (READ). The instructions are generally sent via instruction outputs that are able to be discrete outputs sharing the communication bus 630. Alternatively, the instructions are multiplexed into other data along the bus 630. Although the depiction of FIG. 6 has been simplified for clarity, the person of ordinary skill having the benefit of this disclosure will readily appreciate that such a system is able to be incorporated in a computer, a server, a hand held computing device, a mobile phone, or any other device that incorporates a memory feature. The memory device 610 preferably has been trimmed with dynamic reference margins as described above in FIG. 2 by a method such as the method of FIG. 5. In some applications, the controller 620 is able to be a discrete device. Alternatively, the controller 620 is able to be integrated into a microprocessor or co-processor. In other embodiments, the controller 620 and the memory device 610 are able to be integrated into one monolithic semiconductor device. In still other embodiments, the controller 620 and the memory device 610 are able to be discrete die housed in a single semiconductor package, known as a multi chip module. The communication bus 630 is able to be any known or application specific communication apparatus, method or protocol to enable communication between the memory device 610 and controller 620. The memory device 610 is able to communicate the dynamically trimmed threshold margins to the controller 620 via the communication bus 630. The controller 620 is then able to adjust instructions such as PGM, ERS, READ, and the like to correspond to the threshold margins provided by the memory device 610. The memory device 610 is able to communicate the threshold margins to the controller 620. This communication is able to be triggered by a request from the controller 620 or spontaneously by the memory device 610. The threshold margins are able to be stored on the memory device 610 or the controller 620, or an external memory device. By way of example, one controller 620 or external memory device is able to store threshold margins for multiple memory devices having differing threshold margins.

The present invention has been described in terms of specific embodiments incorporating details to facilitate the understanding of principles of construction and operation of the invention. Such reference herein to specific embodiments and details thereof is not intended to limit the scope of the claims appended hereto. It will be readily apparent to one skilled in the art that other various modifications are able to be made and equivalents are able to be substituted for elements or method steps in the embodiments chosen for illustration without departing from the spirit and scope of the invention as defined by the claims.

What is claimed is:

1. A method for trimming memory devices, comprising:
  a. selecting a sample number of memory devices among a plurality of memory devices;
  b. encoding a default margin level on the selected samples;
  c. exposing the selected samples to a test signal;
  d. determining an average response of each memory device to achieve a successful instruction; and
  e. calculating a margin level based upon the determined average.

2. The method of claim 1 wherein the margin level comprises a program margin level.

3. The method of claim 1 wherein the margin level comprises an erase margin level.

4. The method of claim 1 wherein the margin level comprises a read margin level.

5. The method of claim 1 wherein selecting a sample number of memory devices among a plurality of memory devices comprises selecting sectors from a plurality of locations on a die.

6. The method of claim 1 wherein encoding a default margin level on the selected samples comprises programming the margin level into memory within the device.

7. The method of claim 1 wherein encoding a default margin level on the selected samples comprises tripping at least one fuse integrated on the device.

8. The method of claim 1 wherein determining an average required signal level to achieve a successful instruction comprises comparing the test signal to a set of pre-determined references.

9. The method of claim 1 wherein determining an average response of each memory device to achieve a successful instruction comprises performing a linear search until an instruction is achieved.

10. The method of claim 1 wherein determining an average response of each memory device to achieve a successful instruction comprises performing a binary search until an instruction is achieved.

11. The method of claim 1 further comprising:
  a. trimming the selected numbers of memory devices with the margin level;
  b. comparing an overall yield to a yield achieved with the default margin level; and
  c. trimming the remaining plurality of memory devices with the margin level.

* * * * *